US 9,198,336 B2

(12) United States Patent
Kihara et al.

(10) Patent No.: US 9,198,336 B2
(45) Date of Patent: Nov. 24, 2015

(54) ELECTRIC COMPONENT MOUNTING SYSTEM AND ELECTRIC COMPONENT MOUNTING METHOD

(75) Inventors: Masahiro Kihara, Fukuoka (JP); Masafumi Inoue, Saga (JP); Wataru Hidese, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1455 days.

(21) Appl. No.: 11/813,872

(22) PCT Filed: Jan. 20, 2006

(86) PCT No.: PCT/JP2006/001267
§ 371 (c)(1),
(2), (4) Date: Jul. 13, 2007

(87) PCT Pub. No.: WO2006/078068
PCT Pub. Date: Jul. 27, 2006

(65) Prior Publication Data
US 2010/0071195 A1 Mar. 25, 2010

(30) Foreign Application Priority Data
Jan. 21, 2005 (JP) ................. 2005-013656

(51) Int. Cl.
 H05K 3/30 (2006.01)
 H05K 13/04 (2006.01)
 H05K 13/00 (2006.01)
(52) U.S. Cl.
 CPC ........ *H05K 13/0413* (2013.01); *H05K 13/0069* (2013.01); *Y10T 29/49004* (2015.01); *Y10T 29/53174* (2015.01)
(58) Field of Classification Search
 CPC .......... H05K 13/0069; H05K 13/0413; H05K 13/08; Y10T 29/53174; Y10T 29/49004; Y10T 29/4913; Y10T 29/49131; Y10T 29/53039; Y10T 29/53048
USPC ............. 901/40; 29/709, 720, 739, 740, 29/832–834, 712; 356/394, 631, 623; 348/94; 382/145
See application file for complete search history.

(56) References Cited

U.S. PATENT DOCUMENTS 5,086,556 A 2/1992 Toi
5,097,516 A * 3/1992 Amir .............................. 348/94
(Continued)

FOREIGN PATENT DOCUMENTS

EP 0877544 11/1998
JP 04-048698 A 2/1992
(Continued)

OTHER PUBLICATIONS
Japanese Office Action dated Apr. 14, 2009.

*Primary Examiner* — Donghai D Nguyen
(74) *Attorney, Agent, or Firm* — Pearne & Gordon LLP

(57) ABSTRACT

An electronic component mounting system mounts an electronic component on a substrate to manufacture a mounting substrate, and can prevent a mounting failure due to a positional error in a height direction of a substrate and ensure mounting quality. A print test device for testing the substrate after solder printing measures a height position of a height measurement point set on the upper surface of the substrate 4 by a height measuring machine 22 and outputs a measurement result as substrate height data. In a component placing step using an electronic component placing device, a control parameter for controlling a component placing operation of the placing head 32 is updated. Accordingly, it is possible to correct a variation of the height position of an individual substrate and to prevent a mounting failure due to positional error in the height direction of the substrate.

8 Claims, 10 Drawing Sheets

(56) References Cited

U.S. PATENT DOCUMENTS

| | | | |
|---|---|---|---|
| 5,450,204 A * | 9/1995 | Shigeyama et al. | 356/631 |
| 6,282,779 B1 * | 9/2001 | Nakano et al. | 29/832 |
| 6,429,387 B1 * | 8/2002 | Kuribayashi et al. | 29/833 |
| 6,678,062 B2 * | 1/2004 | Haugen et al. | 356/623 |
| 6,757,966 B2 * | 7/2004 | Inoue | H05K 13/0413 29/712 |
| 2001/0055069 A1 | 12/2001 | Hudson | |
| 2002/0083570 A1 | 7/2002 | Inoue et al. | |

FOREIGN PATENT DOCUMENTS

| | | |
|---|---|---|
| JP | 08-288691 A | 11/1996 |
| JP | 2002134899 | 5/2002 |

* cited by examiner

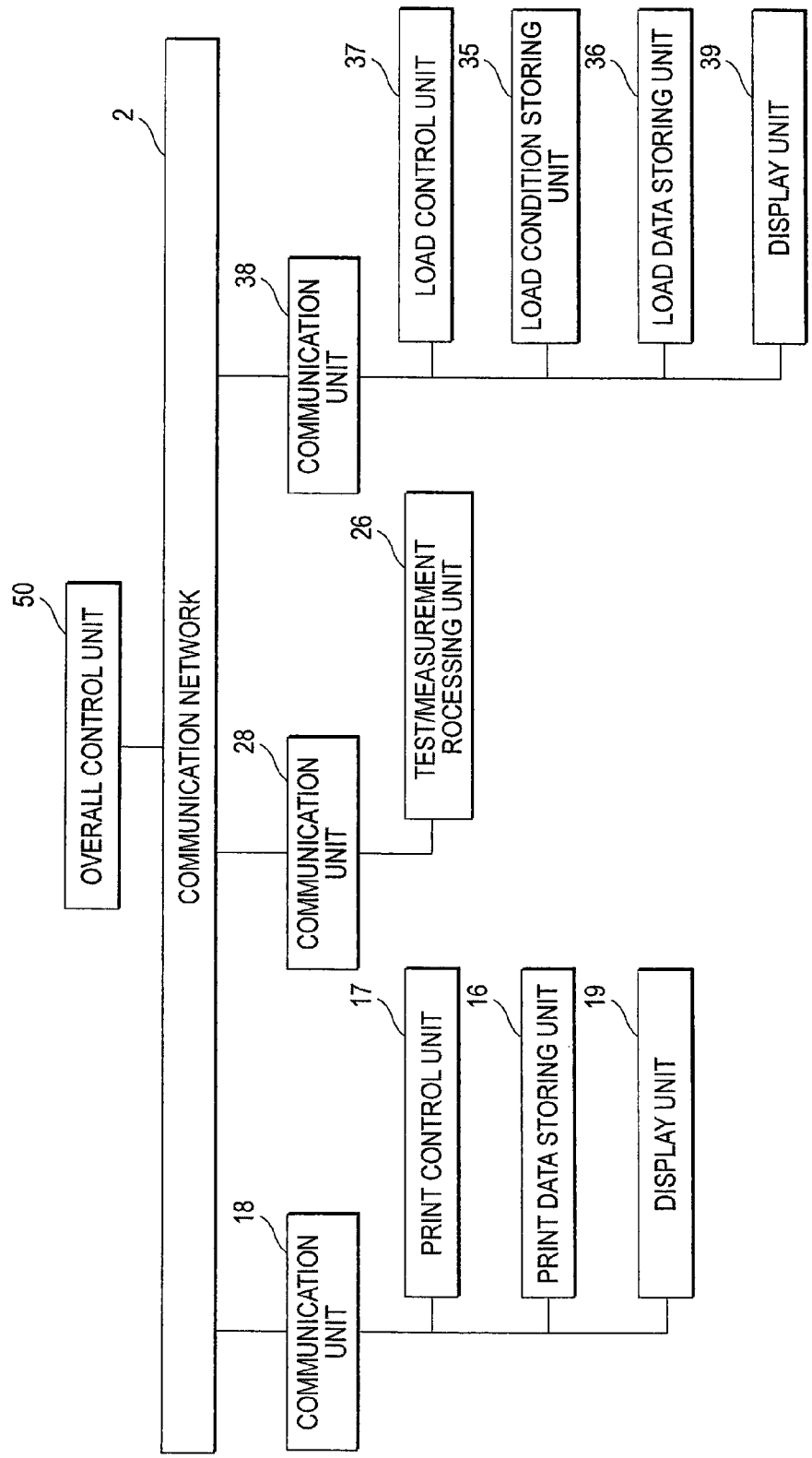

ELECTRIC COMPONENT MOUNTING SYSTEM AND ELECTRIC COMPONENT MOUNTING METHOD

TECHNICAL FIELD

The present invention relates to an electronic component mounting system and an electronic component mounting method for mounting an electronic component on a substrate.

BACKGROUND ART

An electronic component mounting system for mounting an electronic component on a substrate by solder joint to manufacture a mounting substrate includes a plurality of electronic component mounting devices such as a solder print device, an electronic component placing device, and a reflow device, all of which are connected to one another. Such an electronic component mounting system, an electronic component mounting line having a test function, such as a configuration of arranging test devices between devices, is introduced in order to reliably manage quality (for example, see Japanese Patent Publication JP-A-2002-134899).

In the example disclosed in JP-A-2002-134899, a print test device is arranged between a print device and an electronic component placing device, and, when the print test device detects an abnormal state such as misalignment in a print sate of the print device, the print test device transmits feedback information for solving the abnormal state to the print device and feed-forward information for performing a placing operation after solving the affect of the abnormal state to the electronic component placing device of a post-process. By this configuration, high quality management can be realized in the mounting substrate manufacturing process.

Recently, as an electronic apparatus is miniaturized, the size of an electronic component is reduced, a mounting condition is more finely set at the time of mounting the small-sized component, and thus a precise placing operation must be performed by a placing head. In other words, in order to stably mounting the small-sized component with high position precision, it is preferable that operation precision in a nozzle falling operation when holding the electronic component by an absorbing nozzle and landing the electronic component at a mounting point of a substrate is highly managed, in addition to mounting position precision in a horizontal direction of the substrate.

However, in a conventional device disclosed in JP-A-2002-134899, the mounting position precision in the horizontal direction is detected and corrected, but position precision in a height direction is not detected and corrected. To this end, when the substrate has a thickness variation or curvature deformation, the electronic component cannot be adequately landed at the mounting point of the substrate and thus a mounting failure such as component misalignment may be caused. In the conventional mounting system, it is difficult to efficiently prevent the mounting failure due to positional error in the height direction of the substrate.

DISCLOSURE OF INVENTION

Accordingly, an object of the present invention is to provide an electronic component mounting system and an electronic component mounting method which can prevent the mounting failure due to the positional error in the height direction of the substrate and ensure mounting quality.

According to the present invention, there is provided an electronic component mounting system which includes a plurality of electronic component mounting devices connected to one another and mounts an electronic component on a substrate to manufacture a mounting substrate, comprising: a substrate height measuring device having a substrate height measuring function for measuring a height position of a height measurement point set on the upper surface of the substrate and outputting a measurement result as substrate height data; an electronic component placing device which picks up the electronic component from a component supply unit by a placing head and places the electronic component on the substrate; and a parameter updating means which updates a control parameter for controlling a component placing operation of the placing head of the electronic component placing device based on the substrate height data.

According to the present invention, there is provided an electronic component mounting method for mounting an electronic component on a substrate to manufacture a mounting substrate by a plurality of electronic component mounting devices connected to one another, comprising: a substrate height measuring step for measuring a height position of a height measurement point set on the upper surface of the substrate and outputting a measurement result as substrate height data; and a placing step for picking up the electronic component from a component supply unit by a placing head of an electronic component placing device and placing the electronic component on the substrate, wherein, at the time of performing the placing step, a control parameter for controlling a component placing operation of the placing head of the electronic component placing device is updated based on the substrate height data.

According to the present invention, since a height position of a height measurement point set on the upper surface of a substrate is measured such that a measurement result is output as substrate height data, and, at the time of performing a placing step, a control parameter for controlling a component placing operation of the placing head of the electronic component placing device is updated based on the substrate height data, a variation in the height position of an individual substrate is corrected and thus a mounting failure due to positional error in a height direction of the substrate can be prevented.

BRIEF DESCRIPTION OF DRAWINGS

FIG. 5 is a block diagram of a control unit of the electronic component mounting system according to an embodiment of the present invention.

BEST MODE FOR CARRYING OUT THE INVENTION

Next, embodiments of the present invention will be described with reference to the accompanying drawings.

Figure 1:
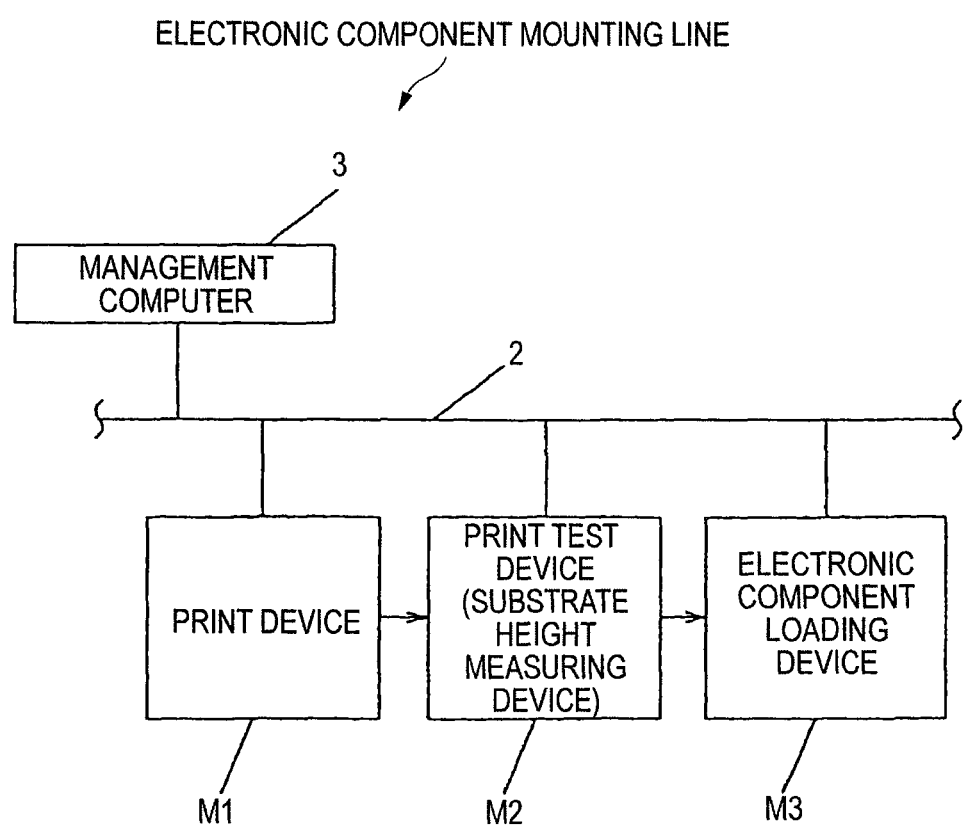
FIG. 1 is a block diagram illustrating a configuration of an electronic component mounting system according to an embodiment of the present invention.

First, the electronic component mounting system will be described with reference to FIG. 1. In FIG. 1, in the electronic component mounting system, an electronic component mounting line 1 includes a print device M1, a print test device M2, and an electronic component placing device M3, all of which are electronic component mounting devices and connected to one another by a communication network 2, and controlled by a management computer 3. By the plurality of electronic component mounting devices, an electronic component is mounted on a substrate to manufacture a mounting substrate.

The print device M1 screen-prints a soldering paste for joining the electronic component on an electrode of the substrate. The print test device M2 tests a print state of the printed soldering paste, detects a height position of a height measurement point set on the upper surface of the substrate after printing, and outputs the detected result as substrate height data. The electronic component placing device M3 places the electronic component on the substrate on which the soldering paste is printed.

Figure 2:
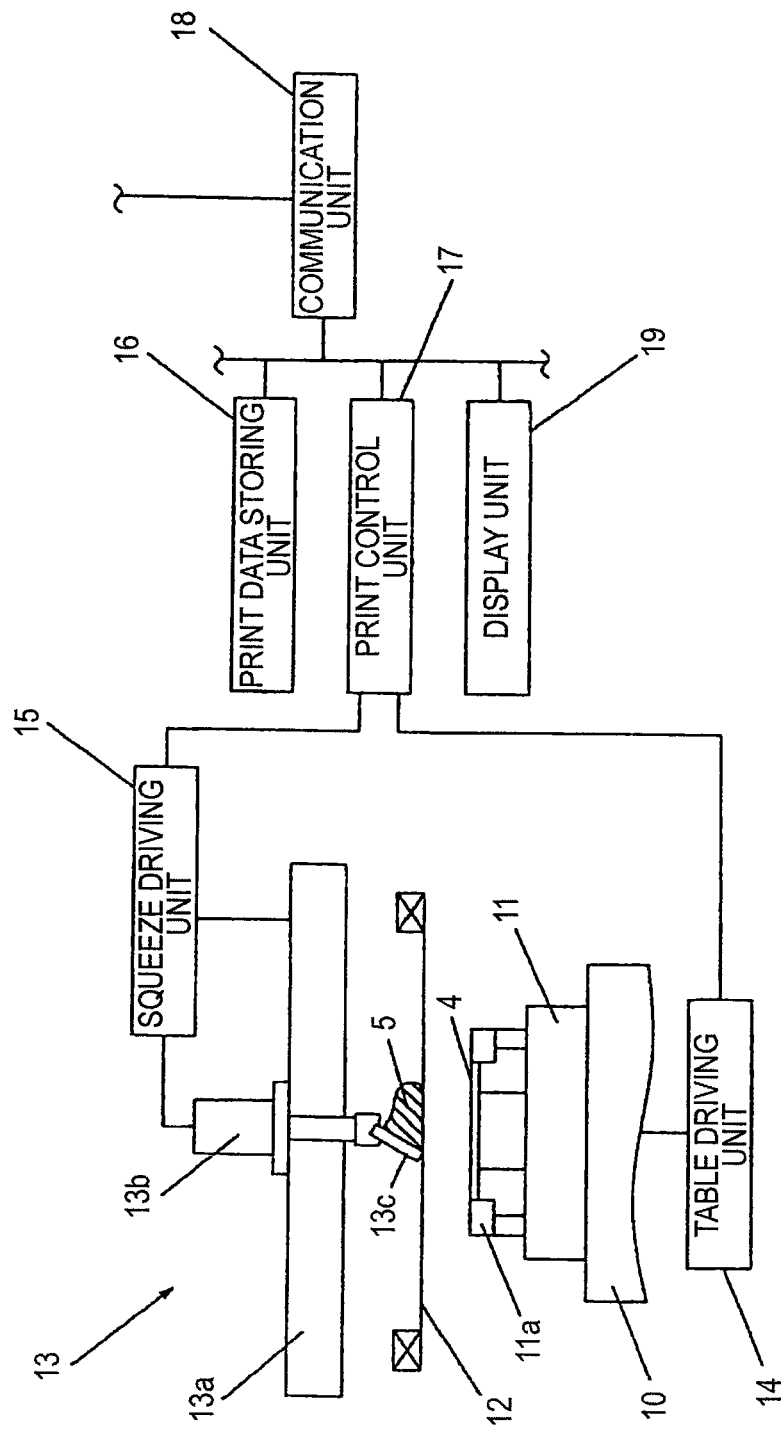
FIG. 2 is a block diagram illustrating a configuration of a screen print device according to an embodiment of the present invention.

Next, the configurations of the devices will be described. First, the configuration of the print device M1 will be described with reference to FIG. 2. In FIG. 2, a substrate holding unit 11 is provided on a positioning table 10. The substrate holding unit 11 holds a substrate 4 by fitting the both sides of the substrate 4 into a damper 11a. A mask plate 12 is provided above the substrate holding unit 11 and a pattern hole (not illustrated) corresponding to a print portion of the substrate 4 is formed in the mask plate 12. By driving the positioning table 10 by a table driving unit 14, the substrate 4 relatively moves with respect to the mask plate 12 in a horizontal direction and a vertical direction.

A squeeze unit 13 is provided above the mask plate 12. The squeeze unit 13 includes an elevating/pressing mechanism 13b for elevating a squeeze 13c with respect to the mask plate 12 and pressing the squeeze 13c with respect to the mask plate 12 with a predetermined press force and a squeeze moving mechanism 13a for horizontally moving the squeeze 13c. The elevating/pressing mechanism 13b and the squeeze moving mechanism 13a are driven by a squeeze driving unit 15. By horizontally moving the squeeze 13c at a predetermined speed along the surface of the mask plate 12 to which a soldering paste 5 is fed, in a state of bringing the substrate 4 into contact with the lower surface of the mask plate 12, the soldering paste 5 is printed on the upper surface of the substrate 4 through the pattern hole (not illustrated).

This print operation is performed by controlling the table driving unit 14 and the squeeze driving unit 15 by a print control unit 17. At the time of controlling, the operation of the squeeze 13c or the alignment between the substrate 4 and the mask plate 12 is controlled based on print data stored in a print data storing unit 16. A display unit 19 displays various indication data representing an operation state of the print device or abnormal annunciation representing an abnormal state of the print operation. A communication unit 18 transmits/receives data to/from the management computer 3 or the other devices configuring the electronic component mounting line 1 over the communication network 2.

Figure 3:
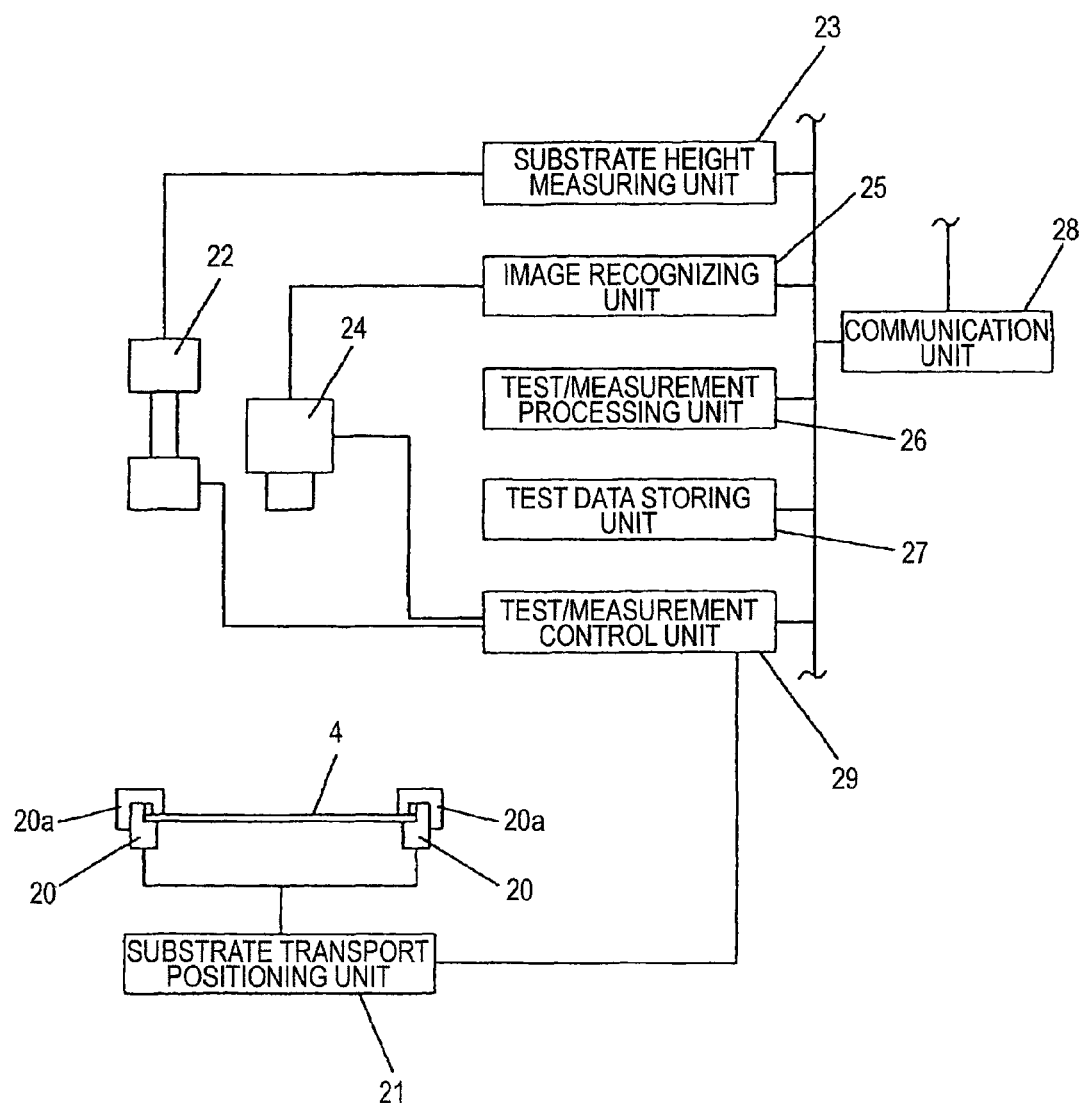
FIG. 3 is a block diagram illustrating a configuration of a print test device according to an embodiment of the present invention.

Next, the print test device M2 will be described with reference to FIG. 3. In FIG. 3, the substrate 4 of which the both ends are clamped by a clamp member 20a is held on a transport rail 20. By driving a substrate transport positioning unit 21, the transport rail 20 transports and positions the substrate 4 at a position for the below-described test and measurement.

A height measuring machine 22 and a camera 24 are provided above the substrate 4 held on the transport rail 20. The height measuring machine 22 has a function for precisely measuring the distance to a measurement object. The height measuring machine 22 measures a height measurement point set on the substrate and a substrate height measuring unit 23 processes measurement data, thereby obtaining a height position of the height measurement point. In addition, an image recognizing unit 25 recognizes a result photographed by the camera 24 to test the print state of the soldering paste. The height measuring machine 22 and the camera 24 can move in a horizontal plane by moving units, respectively, and any position of the substrate 4 may be a height measurement object or a test object.

The height data obtained by measuring the height and a print state test result are processed by a test/measurement processing unit 26 and output as substrate height data and print state testing result. The output data are transmitted to the management computer 3 or the other device over a communication unit 28 and the communication network 2. A test/measurement control unit 29 controls the substrate transport positioning unit 21, the height measuring machine 22, and the camera 24 to control the test/measurement operation. Accordingly, the print test device M2 is a substrate height measuring device having a substrate height detecting function for measuring the height position of the height measurement point set on the upper surface of the substrate 4 and outputting a detection result as the substrate height data.

Figure 4:
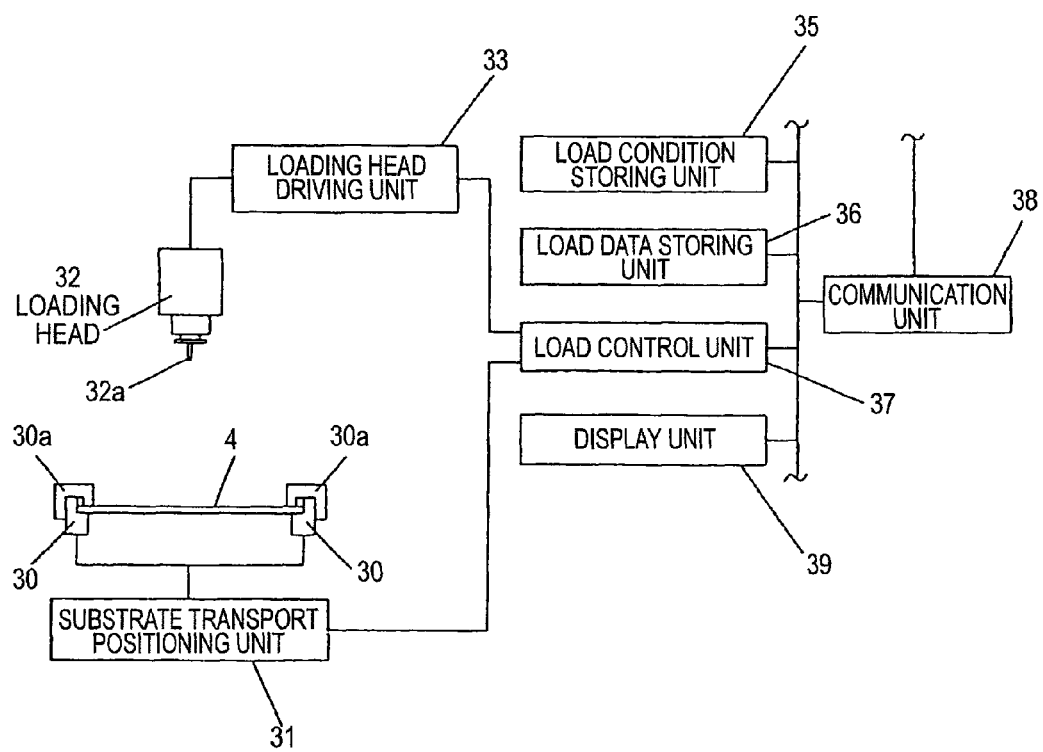
FIG. 4 is a block diagram illustrating a configuration of an electronic component placing device according to an embodiment of the present invention.

Next, the configuration of the electronic component placing device M3 will be described with reference to FIG. 4. In FIG. 4, the substrate 4 of which the both ends are clamped by a clamp member 30a is held on a transport rail 30. In the transport rail 30, the clamp member 30a for clamping the substrate 4 has the same structure as that of the clamp member 20a of the transport rail 20 in the print test device M2 and the substrate 4 is held in the same clamp state as that at the time of print testing. By driving a substrate transport positioning unit 31, the transport rail 30 transports and positions the substrate 4 at a component placing position of the below-described placing head 32.

The placing head 32, which moves by a head driving mechanism (not illustrated), is provided above the substrate 4 held on the transport rail 30. The placing head 32 includes a nozzle 32a for attaching the electronic component, and attaches and extracts the electronic component from a component supply unit (not illustrated) by the nozzle 32a. Thereafter, the placing head 32 moves onto the substrate 4 and falls toward the substrate 4 such that the electronic component held by the nozzle 32a is placed on the substrate 4.

In the placing operation, a place control unit 37 controls a substrate transport positioning unit 31 and a placing head driving unit 33 based on place data stored in a place data storing unit 36, that is, a coordinate for mounting the electronic component on the substrate 4 and thus it is possible to control the electronic component placing position of the substrate 4 by the placing head 32. At this time, the placing head 32 is controlled by place condition data stored in a place condition storing unit 35, that is, a control parameter for controlling the detail of an operation pattern when elevating the nozzle 32a by the placing head 32 in the placing operation, and thus more precise placing operation can be performed as described below.

A display unit 39 displays indication data representing various movement states of the electronic component placing device M3 or abnormal annunciation representing an abnormal state of the placing operation. A communication unit 38 transmits/receives data to/from the management computer 3 or the other devices configuring the electronic component mounting line 1 over the communication network 2.

Next, the configuration of the control unit of the electronic component mounting system will be described with reference to FIG. 5. Here, a data transmitting/receiving function for updating the control parameter in the electronic component mounting process will be described. In FIG. 5, an overall control unit 50 performs a data transmitting/receiving function in a control range which is executed by the management computer 3, receives the data from the respective devices configuring the electronic component mounting line over the communication network 2, and outputs data for updating the parameter to the respective devices over the communication network 2 based on a predetermined process algorithm.

In other words, the test/measurement processing unit 26 included in the print test device M2 illustrated in FIG. 3 is connected to the communication network 2 through the communication unit 28. In addition, the respective units (see FIG. 2 and FIG. 4) included in the print device M1 and the electronic component placing device M3 are connected to the communication network 2 through the communication devices 18 and 38, respectively. Accordingly, a feedback process for correcting and updating the control parameter of a upstream device or a feed-forward process for correcting and updating the control parameter of a downstream device based on the data extracted in the test/measurement process of the print test device M2 can be, if necessary, performed during operating the respective devices. In addition, the control units of the respective devices may have functions for controlling the data transmission/reception, respectively, without providing the management computer 3.

Figure 6A:
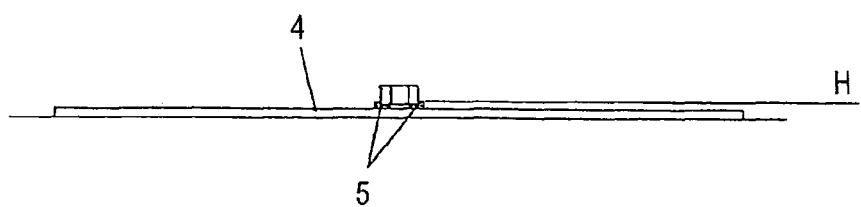
FIGS. 6(a) and 6(b) are cross-sectional views of a substrate which is a component placing object, according to an embodiment of the present invention.

Next, the substrate height measurement performed in the print test device M2 for detecting the curvature deformation of the substrate 4 which is the mounting object and the curvature deformation state will be described with reference to FIGS. 6(a), 6(b), 7(a) and 7(b). FIG. 6(a) illustrates a normal state which the substrate 4 is not deformed. When the electronic component 6 is mounted on the substrate 4, a mounting height position H is set on the basis of the upper surface of the soldering paste 5 printed on the substrate 4. In addition, in the placing operation using the placing head 32, the operation of the placing head 32 is controlled based on the mounting height position H.

Figure 6B:
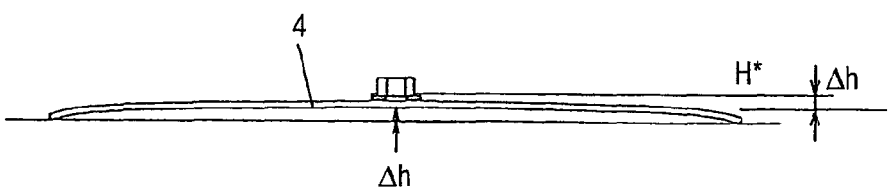

FIG. 6(b) illustrates a state which the substrate 4 is actually deformed. When the placing object is a thin substrate having low rigidity, such as a resin substrate, as illustrated in FIG. 6(b), the curvature deformation which is convex upward is apt to be generated in the substrate 4 and, in the mounting position in the substrate, a displacement $\Delta h$ is generated in a vertical direction with respect to the normal state. When the substrate 4 of this state is subjected to the same component placing operation as that of a case of using the substrate 4 of the normal state illustrated in FIG. 6(a) by the placing head 32, the component may not be normally mounted. Accordingly, in the electronic component mounting method according to the present embodiment, before placing the electronic component, the substrate height is measured by the print test device M2 to previously detect the displacement $\Delta h$, a corrected mounting height position H* is obtained by the displacement $\Delta h$, and an optimal component placing operation is performed by the placing head 32 on the basis of the corrected mounting height position.

Figure 7A:
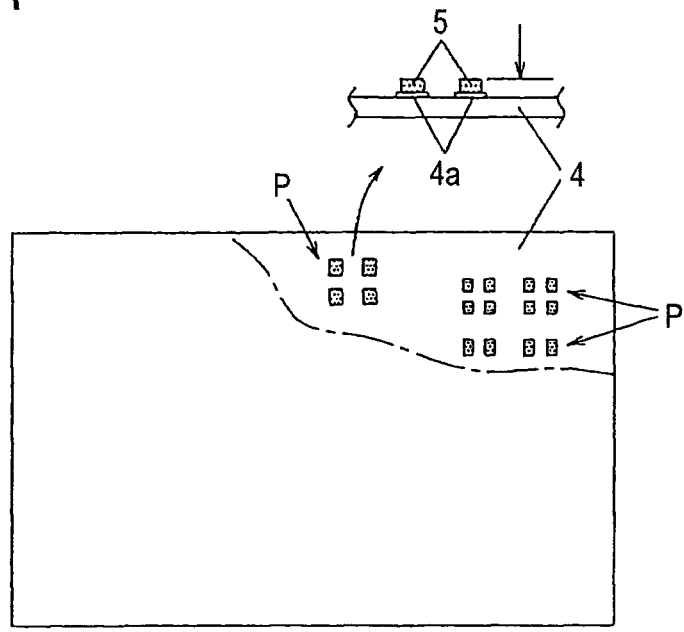
FIGS. 7(a) and 7(b) are plan views of the substrate which the component placing object, according to the embodiment of the present invention.

As a method for setting a measurement object in the substrate height measurement, two methods illustrated in FIG. 7 can be selected in accordance with the kind of the electronic component 6 or the deformation state of the substrate 4 which is the mounting object. In other words, when the substrate 4 is irregularly deformed without a regular tendency or the electronic component to be mounted requires mounting height control of high precision, as illustrated in FIG. 7(a), the height position of the upper surface of the soldering paste 5 printed on the electrode 4a is directly measured using the component mounting position P after solder printing as the height measurement point. Accordingly, the corrected mounting height position H* illustrated in FIG. 6(b) can be directly obtained by the measurement.

Figure 7B:
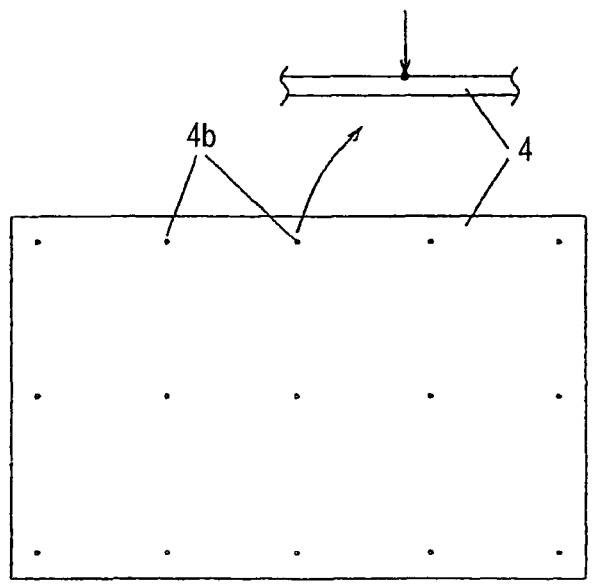

FIG. 7(b) illustrates an example of performing the height measurement on the height measurement point 4b which is previously set on the substrate 4 regardless of the mounting position. In this case, arrangement (for example, lattice arrangement) of the height measurement point suitable for estimating an overall deformation shape of the substrate 4 is set, and the surface shape of the substrate 4 is estimated from the height measurement results of a plurality of measurement points by a three-dimensional manner. In other words, the displacement $\Delta h$ in the vertical direction at any position of the substrate 4 is proximately obtained by a numerical operation and the displacement $\Delta h$ is added to the mounting height position H illustrated in FIG. 6(a), thereby obtaining the corrected mounting height position H*.

In the present embodiment, based on the substrate height measurement result, the control parameters in the component placing operation, that is, a speed parameter, a position parameter, and a place parameter as well as the corrected mounting height position H* are updated and corrected as described below. In the conventional device, the control parameters were previously set to fixed values in accordance with the kind of the component, but, in the present embodiment, the control parameters, which have different values in accordance with the substrate height measurement result with respect to every kind of component, are stored in the place condition storing unit 35 in a data table form.

In addition, whenever the print test device M2 performs the substrate height measurement with respect to each substrate, the electronic component placing device M3 receives the substrate height measurement result as the substrate height data and a place control unit 37 reads a parameter value according to the substrate height measurement result from the data table and replaces the control parameter with the previously set value, thereby precisely adjusting the control parameter. Accordingly, the place control unit 37 is a parameter updating means which updates the control parameters for controlling the component placing operation of the placing head 32 in the electronic component placing device M3 based on the substrate height data. By updating the control parameters in accordance with the substrate height measurement result, the component placing operation is more finely controlled using the placing head 32. Thus, the component can be placed without generating component misalignment or component mis-place, and a solder joint condition in a reflow process of the post-process is adequately ensured, thereby mounting the component with high precision or excellent reliability.

Figure 8A:
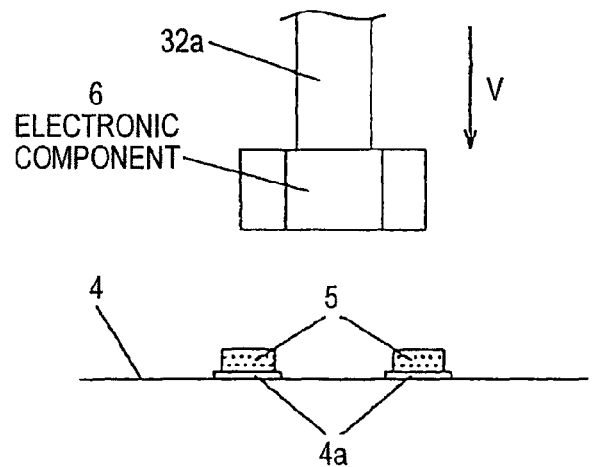
FIGS. 8(a) to 8(c) are views explaining a control parameter in an electronic component placing operation according to an embodiment of the present invention.
Figure 8B:
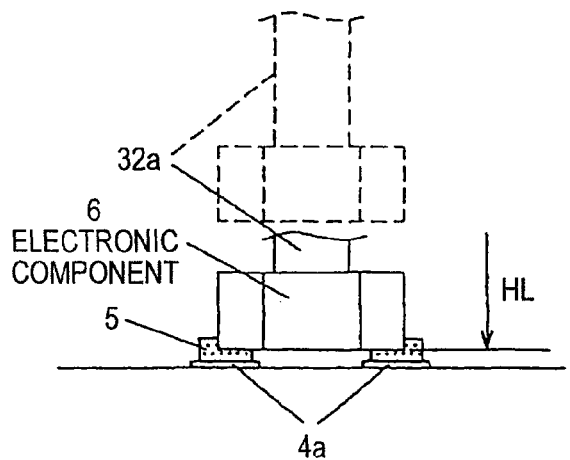
Figure 8C:
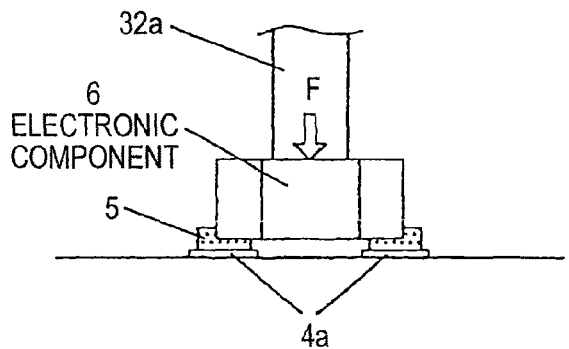

As illustrated in FIG. 8(a), the speed parameter is a control parameter for regulating a speed pattern of a head elevating speed V for elevating the placing head 32 with respect to the substrate 4. As illustrated in FIG. 8(b), the position parameter is a control parameter for regulating a lower limit stop position HL of the electronic component 6 when the placing head 32 for holding the component 6 using the nozzle 32a falls. In addition, as illustrated in FIG. 8(c), the place parameter is a control parameter for regulating a press force F for pressing the electronic component 6 with respect to the substrate 4 by the placing head 32.

Furthermore, the control parameters are not limited to the above-described items and the other items may be linked to the substrate height measurement result. For example, when the electronic substrate 6 is landed on the substrate 4 and the nozzle 32a is then separated from the upper surface of the electronic component 6 held on the soldering paste 5, an air blow operation for blowing positive-pressure air from the nozzle 32a is performed. A blow pressure or air blow timing in the air blow operation is employed as a variable control parameter, which may vary depending on the substrate height measurement result.

Figure 9:
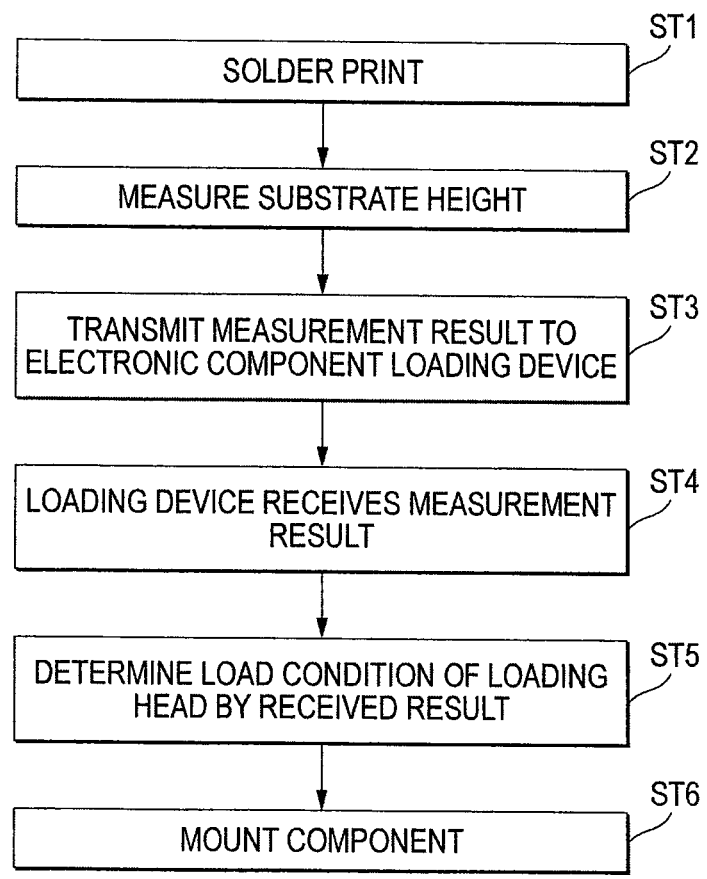
FIG. 9 is a flowchart illustrating operations of the electronic component mounting system according to an embodiment of the present invention.
Figure 10A:
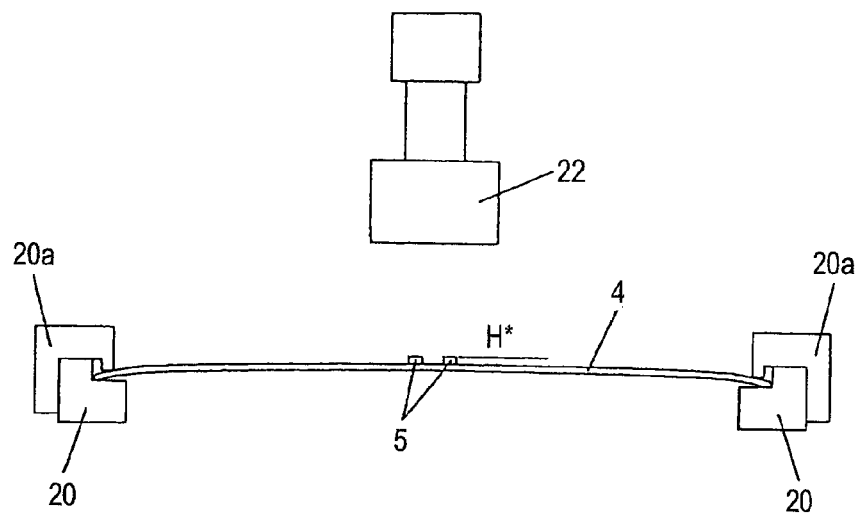
FIGS. 10(a) and 10(b) are views explaining operations of the electronic component mounting system according to an embodiment of the present invention.

Next, the electronic component mounting process performed by the electronic component mounting system will be described with reference to FIGS. 9, 10(a) and 10(b). In this electronic component mounting process, as illustrated in FIG. 9, first, the soldering paste 5 is printed on the substrate 4 by the print device M1 (ST1). Next, the substrate 4 is transported to the print test device M2, in which the solder print state is tested, and, as illustrated in FIG. 10(a), the height measuring machine 22 is positioned above the height measurement point of the substrate 4 to perform the substrate height measurement (ST2).

To this end, the corrected mounting height position H* (see FIG. 6(a)) representing the height position of the upper surface of the soldering paste 5 printed at the mounting position is directly obtained and output as the substrate height data. At this time, as illustrated in FIG. 10(a), since the substrate 4 positioned in the transport rail 20 is clamped by the clamp member 20a with the fixed clamp place, the height measurement is always performed with the same clamp state.

Next, the substrate 4 is transported to the electronic component placing device M3 and the measurement result is transmitted to the electronic component placing device M3 over the communication network 2 (ST3). In addition, the electronic component placing device M3 receives the measurement result (ST4), and determines a mounting condition of the placing head 32 from the received measurement result (ST5). In other words, the above-described control parameters are updated based on the substrate height measurement result in every mounting position. Here, whenever the substrate which is the mounting object is transported to the electronic component placing device M3, the substrate height measurement result of every substrate is transmitted to the electronic component placing device M3 and the control parameters are updated in real time during successive production.

In addition, the placing head 32 performs the component placing operation using the updated control parameters to mount the electronic component 6 on the substrate 4 (ST6). In other words, as illustrated in FIG. 10(a), the placing head 32 for holding the electronic component 6 using the nozzle 32a falls at an adequate speed pattern, the lower surface of the electronic component 6 falls to the lower limit stop position HL corresponding to the corrected mounting height position H*, and the electronic component 6 is pressed by an adequate press place.

To this end, the electronic component 6 is precisely landed at an accurate position without generating the place misalignment due to the unsuitable setting of a falling speed, and stops at a position which is pressed by an adequate press amount from the upper surface of the soldering paste 5. Accordingly, the substrate 4 is aligned in the state that the soldering paste having an adequate thickness is inserted between a joint terminal of the electronic component 6 and the electrode 4a of the substrate 4. In addition, the substrate of this state is transported to a reflow device and heated. Thus, the terminal of the electronic component 6 can be joined to the electrode 4a in an adequate solder joint condition.

Figure 10B:
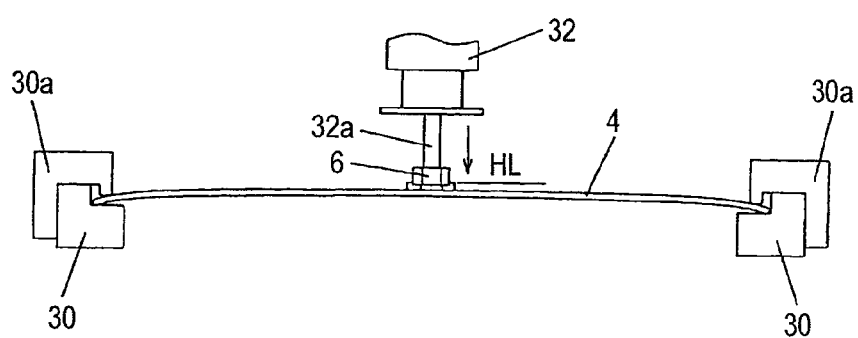

The component is, as illustrated in FIG. 10(b), mounted in the state that the substrate 4 is clamped on the transport rail 30 by the clamp member 30a, but, at this time, the clamp place of the clamp member 30a is set such that the substrate 4 is clamped in the same clamp state as that at the time of the substrate height measurement in the print test device M2. To this end, the component is mounted on the substrate 4 in the same deformation state as that at the time of the substrate height measurement.

In other words, the above-described electronic component mounting method includes a substrate height measuring step for measuring the height position of the height measurement point set on the upper surface of the substrate 4 and outputting the measurement result as the substrate height data in the print test device M2, and a placing step for picking up the electronic component 6 from the component supply unit by the placing head 32 of the electronic component placing device M3 and mounting the electronic component 6 on the substrate 4. At the time of performing the placing step, the control parameters for controlling the component placing operation of the placing head 32 of the electronic component placing device M3 is updated based on the substrate height data.

In addition, as the control parameter, at least one of the speed parameter for regulating the speed pattern of the head elevating speed for elevating the placing head 32 with respect to the substrate 4, the position parameter for regulating the lower limit stop position when the placing head 32 falls, and the place parameter for regulating the press force for pressing the electronic component 6 with respect to the substrate 4 by the placing head 32 is used.

At the time of performing the component placing step, the control parameters for controlling the component placing operation of the placing head 32 based on the substrate height data is updated. Accordingly, even in a case where a substrate in which the curvature deformation is apt to be generated, such as a thin resin substrate, is used as the placing object, the variation of the height position of the individual substrate is corrected and thus a mounting failure due to the positional error in the height direction of the substrate can be prevented. Furthermore, in the conventional device, a lower supporting pin for correcting the curvature was required for a substrate which is apt to be deformed, but, in the present embodiment, the lower supporting pin need not be provided. Thus, a mechanism for supporting the lower portion of the substrate can be simplified.

This application is based upon and claims the benefit of priority of Japanese Patent Application No. 2005-13656 filed on Jan. 21, 2005, the contents of which are incorporated herein by reference in its entirety.

INDUSTRIAL APPLICABILITY

According to an electronic component mounting system and an electronic component mounting method of the present invention, a variation of a height position of an individual substrate is corrected and thus a mounting failure due to positional error in a height direction of the substrate can be prevented. Thus, the present invention can apply to a technology for mounting an electronic component on a substrate to manufacture a mounting substrate.

The invention claimed is:

1. An electronic component mounting system which includes an electronic component mounting line composed of a plurality of electronic component mounting devices connected to one another by a communication network and mounts an electronic component on a substrate to manufacture a mounting substrate, the electronic component mounting line comprising:
    a substrate height measuring device which is one of the plurality of electronic component mounting devices and which has a substrate height measuring function for measuring a height position of a height measurement point set on the upper surface of solder paste printed on the substrate corresponding to a component mounting point and outputting a measurement result as substrate height data of the component mounting point;
    an electronic component placing device which is another one of the plurality of electronic component mounting devices and which picks up the electronic component from a component supply unit by a placing head and places the electronic component on the component mounting point of the substrate;
    a parameter updating means which updates a control parameter for controlling a component placing operation to the component mounting point of the placing head of the electronic component placing device based on the substrate height data of the component mounting point; and
    a transport rail which positions the substrate at a position of measuring the height position of the height measurement point set by the substrate height measuring device and transports the substrate from the substrate height measuring device to the electronic component placing device,
    wherein the measurement result is transmitted from the substrate height measuring device to the electronic component placing device via the communication network, and the electronic component placing device performs the component placing operation using the transmitted measurement result, and
    wherein the substrate is held at the electronic component placing device in a same position state as a time of measuring the height position.

2. The electronic component mounting system according to claim 1, wherein the control parameter includes at least one of a speed parameter for regulating a speed pattern of a head elevating speed for elevating the placing head with respect to the substrate, a position parameter for regulating a lower limit stop position when the placing head falls, or a place parameter for regulating a press force for pressing the electronic component with respect to the substrate by the placing head.

3. The electronic component mounting system according to claim 1, wherein the height measurement point set on the upper surface of the solder paste printed on the substrate is a component mounting position.

4. The electronic component mounting system according to claim 1, wherein the height measurement point set on the upper surface of the solder paste printed on the substrate includes a plurality of measurement points for setting arrangement regardless of the component mounting position.

5. An electronic component mounting method for mounting an electronic component on a substrate to manufacture a mounting substrate by a component mounting line composed of a plurality of electronic component mounting devices connected to one another by a communication network, comprising:
    a substrate height measuring step for measuring a height position of a height measurement point set on the upper surface of solder paste printed on the substrate corresponding to a component mounting point and outputting a measurement result as substrate height data of the component mounting point by a substrate height measuring device which is one of the plurality of electronic component mounting devices; and
    a placing step for picking up the electronic component from a component supply unit by a placing head of an electronic component placing device and placing the electronic component on the component mounting point of the substrate by an electronic component placing device which is another one of the plurality of electronic component mounting devices,
    wherein, at the time of performing the placing step, a control parameter for controlling a component placing operation to the component mounting point of the placing head of the electronic component placing device is updated based on the substrate height data of the component mounting point,
    wherein the measurement result is transmitted from the substrate height measuring device to the electronic component placing device via the communication network, and the electronic component placing device performs the component placing operation using the transmitted measurement result,
    wherein, in the substrate height measuring step, the substrate is positioned by a transport rail at a position of measuring the height position of the height measurement point set by the substrate height measuring device and transported by the transport rail from the measuring device to the electronic component placing device, and
    wherein, in the placing step, the substrate is held at the electronic component placing device in a same position state as a time of measuring the height position.

6. The electronic component mounting method according to claim 5, wherein the control parameter includes at least one of a speed parameter for regulating a speed pattern of a head elevating speed for elevating the placing head with respect to the substrate, a position parameter for regulating a lower limit stop position when the placing head falls, or a place parameter for regulating a press force for pressing the electronic component with respect to the substrate by the placing head.

7. The electronic component mounting method according to claim 5, wherein the height measurement point set on the upper surface of the solder paste printed on the substrate is a component mounting position.

8. The electronic component mounting method according to claim 5, wherein the height measurement point set on the upper surface of the solder paste printed on the substrate includes a plurality of measurement points for setting arrangement regardless of the component mounting position.

* * * * *